(12) United States Patent
Donoghue et al.

(10) Patent No.: US 10,686,417 B2
(45) Date of Patent: Jun. 16, 2020

(54) RADIO FREQUENCY AMPLIFIER

(71) Applicant: CAMBRIDGE CONSULTANTS LIMITED, Cambridge, Cambridgeshire (GB)

(72) Inventors: Bryan James Donoghue, Cambridge (GB); Desmond Phillips, Cambridge (GB); Tan Robert, Cambridge (GB); Peter-Contesse Herve, Cambridge (GB)

(73) Assignee: CAMBRIDGE CONSULTANTS LIMITED, Cambridge, Cambridgeshire (GB)

( * ) Notice: Subject to any disclaimer, the term of this patent is extended or adjusted under 35 U.S.C. 154(b) by 355 days.

(21) Appl. No.: 15/520,378

(22) PCT Filed: Oct. 20, 2015

(86) PCT No.: PCT/GB2015/053126
§ 371 (c)(1),
(2) Date: Apr. 19, 2017

(87) PCT Pub. No.: WO2016/063038
PCT Pub. Date: Apr. 28, 2016

(65) Prior Publication Data
US 2018/0302048 A1    Oct. 18, 2018

(30) Foreign Application Priority Data

Oct. 20, 2014   (GB) .................................. 1418622.5

(51) Int. Cl.
*H03F 3/217*    (2006.01)
*H03F 3/19*     (2006.01)
(Continued)

(52) U.S. Cl.
CPC ............. *H03F 3/2175* (2013.01); *H03F 3/19* (2013.01); *H03M 3/422* (2013.01);
(Continued)

(58) Field of Classification Search
CPC .... H03F 3/2175; H03F 3/19; H03F 2200/171; H03F 2200/451; H03F 2200/331;
(Continued)

(56) References Cited

U.S. PATENT DOCUMENTS

2004/0252038 A1   12/2004  Robinson et al.
2006/0188027 A1    8/2006  Jeckeln et al.
(Continued)

FOREIGN PATENT DOCUMENTS

EP    1487111 A1    12/2004
EP    1753135 A1     2/2007
(Continued)

OTHER PUBLICATIONS

International Search Report and Written Opinion for PCT/GB2015/053126, dated Apr. 12, 2016.
UK Search Report for GB 1418622.5, dated Apr. 15, 2015.

*Primary Examiner* — Khanh V Nguyen
(74) *Attorney, Agent, or Firm* — Merchant & Gould P.C.

(57) ABSTRACT

A modulator circuit includes a plurality of signal processing branches, each branch having a modulator for performing a delta-sigma modulation of a respective data stream portion in order to generate a modulated signal. The modulator circuit receives an input data stream having a carrier frequency; splits the input data stream into a plurality of data stream portions. Delta-sigma modulation is performed in each branch on a respective data stream portion. The respective modulated signals from each branch are combined to form an output signal for outputting at the carrier frequency.

25 Claims, 10 Drawing Sheets

(51) Int. Cl.
*H03M 3/00* (2006.01)
*H04B 1/04* (2006.01)
*H04B 1/16* (2006.01)

(52) U.S. Cl.
CPC .. *H03F 2200/171* (2013.01); *H03F 2200/331* (2013.01); *H03F 2200/451* (2013.01); *H03M 3/30* (2013.01); *H03M 3/466* (2013.01); *H03M 3/47* (2013.01); *H03M 3/50* (2013.01); *H04B 1/04* (2013.01); *H04B 1/16* (2013.01); *H04B 2001/0408* (2013.01)

(58) Field of Classification Search
CPC ...... H03F 3/217; H03F 3/2173; H03F 3/2171; H03F 2200/351; H03M 3/422; H03M 3/466; H03M 3/30; H03M 3/47; H03M 3/50; H04B 2001/0408; H04B 1/04; H04B 1/16
USPC .......................................... 330/10, 207 A, 251
See application file for complete search history.

(56) References Cited

U.S. PATENT DOCUMENTS

| | | |
|---|---|---|
| 2012/0146823 A1 | 6/2012 | Silva |
| 2013/0021104 A1* | 1/2013 | Schmidt ................ H03F 1/0277 330/295 |
| 2015/0382109 A1 | 12/2015 | Kuromoto |
| 2016/0072520 A1* | 3/2016 | Pagnanelli ............ H03M 3/468 341/143 |
| 2016/0072647 A1* | 3/2016 | Azadet .................. H04L 1/0054 375/295 |
| 2017/0077945 A1* | 3/2017 | Pagnanelli .............. H03M 3/40 |
| 2017/0111188 A1* | 4/2017 | Deng .................. H04L 25/0328 |
| 2018/0145700 A1* | 5/2018 | Yu ........................ H03M 7/3004 |
| 2018/0343014 A1* | 11/2018 | Todorokihara ....... G01R 23/005 |

FOREIGN PATENT DOCUMENTS

| | | |
|---|---|---|
| EP | 2063536 A1 | 5/2009 |
| JP | 2001-024512 A | 1/2001 |
| JP | 2004-096434 A | 3/2004 |
| JP | 2005-006273 A | 1/2005 |
| JP | 2013-081106 A | 5/2013 |
| JP | 2014-502801 A | 2/2014 |
| WO | 2008/114236 A2 | 9/2008 |
| WO | 2012/024333 A1 | 2/2012 |
| WO | 2012/087731 A1 | 6/2012 |
| WO | 2014/132683 A1 | 9/2014 |

\* cited by examiner

RADIO FREQUENCY AMPLIFIER

This application is a National Stage of PCT/GB2015/053126, filed 20 Oct. 2015, which claims benefit of British Patent Application No. 1418622.5, filed 20 Oct. 2014, which applications are incorporated herein by reference. To the extent appropriate, a claim of priority is made to each of the above disclosed applications.

BACKGROUND OF THE INVENTION

The present invention relates to an amplifier for amplifying radio frequency (RF) signals. The invention has particular but not exclusive relevance to delta-sigma amplifiers for wireless communications systems and devices thereof operating according to the Long Term Evolution (LTE) technologies defined by the $3^{rd}$ Generation Partnership Project (3GPP).

Modern communications standards such as 3G and LTE employ modulation schemes which require linear RF amplifiers. The term 'linear' refers to the ability of an amplifier to produce output signals that are accurate copies of the input signal (generally) at increased power levels. Linear amplification is essential for non-constant envelope signals such as OFDM to prevent the creation of unwanted in-band interference signals. Linear amplification must be achieved for peak signal power, not just for average signal power. Peak signal power can be up to 10 dB higher than average signal power for OFDM signals.

Linearity is usually achieved by backing-off the amplifier's power level to below its maximum (and most efficient) region to a region exhibiting a more linear amplification for both the average and the expected maximum signal level. However, this effectively results in a reduction of the amplifier's overall power efficiency compared to the case when the amplifier operates near its peak power level most of the time. Consequently, linear RF amplifiers typically have a power efficiency of less than 10%.

Various techniques have been employed to achieve more power-efficient linear RF amplifiers, which techniques include, for example, pre-distortion, envelope elimination and restoration, cartesian feedback, and/or the like.

A relatively new approach for efficient linear RF amplification is the use of a so-called S-class amplifier, which uses delta-sigma modulation to generate directly an amplified RF signal. Since S-class amplifiers use field effect transistors (e.g. metal-oxide-semiconductor, 'MOS' transistors) (or other transistors) for generating a modulated signal, and since transistors are either turned on or off, efficiency of S-class amplifiers can theoretically approach 100%.

However, a key problem with S-class amplifiers is how to generate a delta-sigma modulation signal that is fast enough to generate an amplified RF signal. This problem arises because the delta-sigma modulation signal frequency (also referred to as the delta sigma bitstream rate) must be at least twice (typically four times) the carrier frequency of the signal to be amplified (due to the Nyquist sampling theorem). It is difficult to compute the delta-sigma modulation signal at high speed because delta-sigma modulation has a single-cycle feedback loop, which consists of several steps including: summation of the input signal with a loop-filtered error signal; quantisation (usually as truncation of a fixed point binary number); and error feedback into a loop filter. The logic in the delta-sigma modulator must be computed at the delta sigma bitstream rate. Since cellular signals may be transmitted at around 1 GHz (typically in the range of 800-900 MHz for applications such as LTE) or even above 1 GHz, the delta-sigma modulation signal must be generated at several GHz. This effectively means that the delta-sigma modulator logic must operate at an impractically high rate, which would inhibit feasible and/or economical implementation of delta-sigma amplification for radio frequency signals used in LTE systems and/or the like.

SUMMARY OF THE INVENTION

Accordingly, preferred embodiments of the present invention aim to provide methods and apparatus which address or at least partially deal with the above issues.

For simplicity, the present application will use the term delta-sigma ($\Delta\Sigma$) amplifier to refer to any communications device employing a delta-sigma modulation technology for amplification of a transmitted signal (e.g. a data burst). It will also be appreciated that the technology described herein can be implemented on any (mobile and/or generally stationary) communications device that can communicate with another communications device and/or a communications network.

Although for efficiency of understanding for those of skill in the art, the invention will be described in detail in the context of a delta-sigma amplifier for processing high frequency signals, the principles of the invention can be applied to other systems in which delta-sigma modulation is performed.

In one aspect, the invention provides a modulator circuit comprising: means for receiving an input data stream having a carrier frequency (which may be zero); means for splitting the input data stream into a plurality of data stream portions; a plurality of signal processing branches, each signal processing branch comprising means for performing a delta-sigma modulation of a respective data stream portion of said plurality of data stream portions in order to generate a modulated signal; and means for combining the respective modulated signal from each of said plurality of signal processing branches to form an output signal, and for outputting said output signal at said carrier frequency.

The means for receiving an input data stream, the means for splitting, the plurality of signal processing branches, and the means for combining and for outputting may all form part of a first circuit portion and the output signal of said first circuit portion may comprise a first output signal. In this case, the modulator circuit may further comprise: a second circuit portion, the second circuit portion comprising: further means for receiving the input data stream; further means for splitting the input data stream into a further plurality of data stream portions; a further plurality of signal processing branches, each further signal processing branch comprising respective further means for performing a delta-sigma modulation of a respective further data stream portion of said plurality of further data stream portions in order to generate a further modulated signal; and further means for combining the respective further modulated signal from each of said plurality of further signal processing branches to form a further output signal, and for outputting said further output signal at said carrier frequency as a second output signal; and means for generating a combined output signal from said first output signal and said second output signal, wherein said generating comprises applying a respective window function to each of said first and said second output signals and adding the resulting signals together to form said combined output signal.

The applying of a respective window function may comprise applying a respective time dependent weight to each of said first and said second output signals. The respective time dependent weights applied to said first and said second output signals may sum together to give a constant (e.g. 1).

The respective time dependent weights may vary with time in the manner of a substantially triangular waveform. In this case, the substantially triangular waveform may comprise a substantially continuous triangular waveform in which the sides of the triangular wave are substantially linear.

The respective time dependent weights may vary with time in the manner of a stepped waveform. In this case, the respective time dependent weights may vary with time in the manner of a stepped but generally triangular waveform.

The plurality of data stream portions of the first circuit portion may be offset in time compared to the further plurality of data stream portions of the second circuit portion.

The weight applied to the first output signal may be substantially zero at a start and end of each data stream portion of said plurality of data stream portions, and wherein a weight applied to said second output signal is substantially zero at a start and end of each data stream portion of said further plurality of data stream portions.

In another aspect, the invention provides an amplifier circuit comprising the above described modulator circuit.

In another aspect, the invention provides a method performed by a modulator circuit comprising a plurality of signal processing branches having means for performing a delta-sigma modulation, the method comprising: receiving an input data stream having a carrier frequency; splitting the input data stream into a plurality of data stream portions; in each of said plurality of signal processing branches, performing a delta-sigma modulation of a respective data stream portion of said plurality of data stream portions in order to generate a modulated signal; combining the respective modulated signal from each of said plurality of signal processing branches to form an output signal; and outputting said output signal at said carrier frequency.

Aspects of the invention extend to corresponding computer program products such as computer readable storage media having instructions stored thereon which are operable to program a programmable processor to carry out a method as described in the aspects and possibilities set out above or recited in the claims and/or to program a suitably adapted computer to provide the apparatus recited in any of the claims.

Each feature disclosed in this specification (which term includes the claims) and/or shown in the drawings may be incorporated in the invention independently (or in combination with) any other disclosed and/or illustrated features. In particular but without limitation the features of any of the claims dependent from a particular independent claim may be introduced into that independent claim in any combination or individually.

BRIEF DESCRIPTION OF THE DRAWINGS

Embodiments of the invention will now be described, by way of example, with reference to the accompanying drawings in which:

FIG. 8 is an exemplary power spectral density diagram illustrating simulation results when employing the window function shown in FIG. 7a;

FIG. 10 is an exemplary power spectral density diagram illustrating simulation results when employing the window function shown in FIG. 9a.

DETAILED DESCRIPTION OF THE PREFERRED EMBODIMENT(S)

Figure 1:
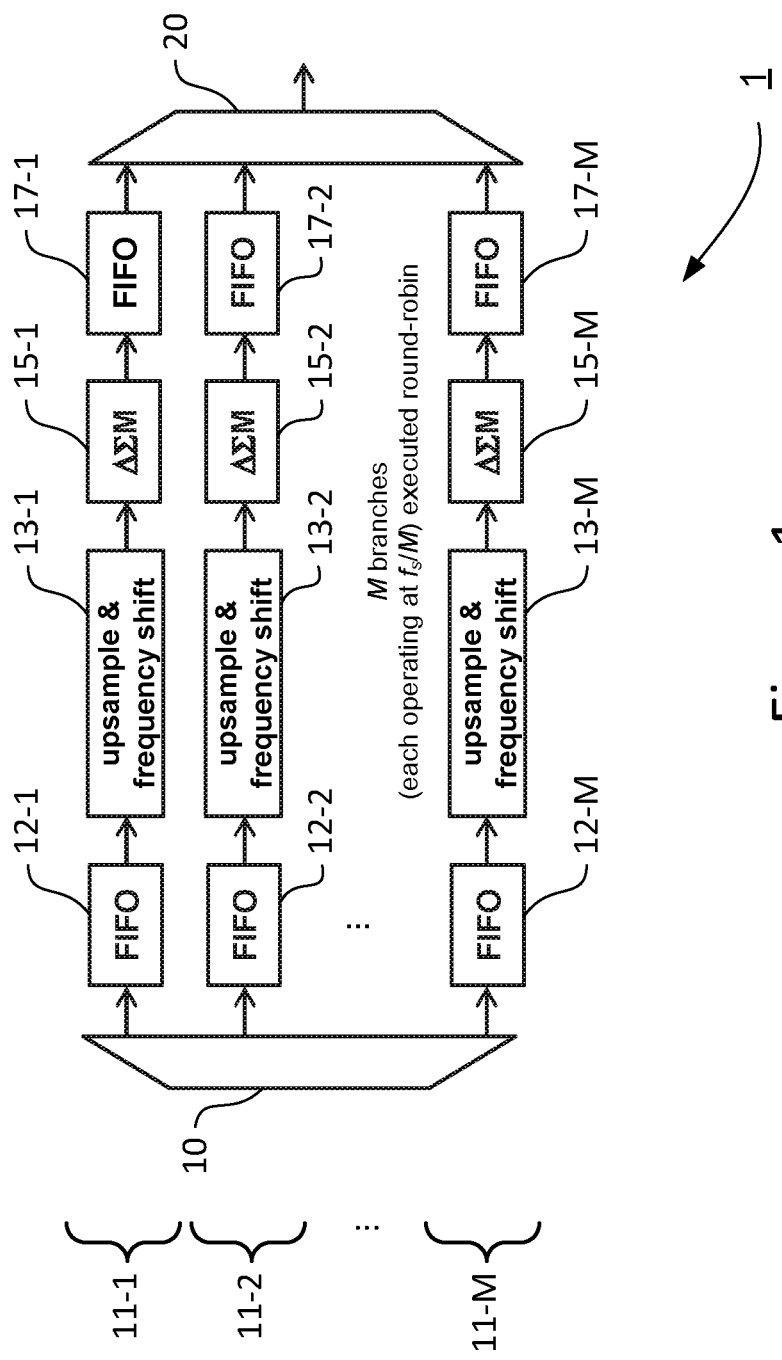
FIG. 1 illustrates schematically a delta-sigma modulator for processing concatenated independent blocks.

FIG. 1 schematically illustrates a delta-sigma modulator circuit 1 for processing RF signals. Specifically, the delta-sigma modulator circuit 1 comprises a so-called Donoghue-Phillips-Tan delta-sigma modulator (hereafter referred to as a DPT modulator 1) forming part of an exemplary (S-Class) RF amplifier 2. As illustrated in more detail in FIG. 2, the RF amplifier 2 includes, amongst others, the DPT modulator 1, transistor switching circuits and a bandpass filter.

In this example, modulation of a transmit signal is achieved using concatenated independent blocks (CIBs). Specifically, each transmit burst (received at demultiplexer 10) is split into a number of consecutive blocks of output symbols and for each block upsampling, frequency shift and modulation is performed independently.

As generally shown in FIG. 1, processing of the consecutive blocks is realised by demultiplexing, in a "round-robin" manner, the blocks of input baseband samples to a number of branches 11-1 to 11-M at the demultiplexer 10. Each branch 11 comprises a respective: input buffer 12-1 to 12-M; optionally an independent upsampler and frequency shift portion 13-1 to 13-M; delta-sigma modulator portion 15-1 to 15-M (denoted 'ΔΣM' in FIG. 1); and output buffer 17-1 to 17-M.

Each input buffer 12 and each output buffer 17 comprises a suitable 'first-in-first-out' (FIFO) input buffer. Each upsampler and frequency shift portion 13 may comprise, for example, a finite impulse response (FIR) filter, cascaded integrator-comb (CIC) filters, oscillator and a frequency mixer, although it will be appreciated that other types of filters and/or other filter combinations and frequency shifters may also be used. It will also be appreciated that the upsampler and frequency shift portions 13-1 to 13-M are optional and may be omitted.

Each block of symbols from the demultiplexer 10 are buffered in the input buffer 12 of a respective branch 11 for processing that block. Symbols are taken from input buffer in a FIFO manner and are (optionally) upsampled and frequency shifted by the corresponding upsampler and frequency shift portion 13 to provide an upsampled and frequency shifted output. The upsampled and frequency shifted output is modulated by the corresponding delta-sigma modulator portion 15. The modulated output from each delta-sigma modulator portion 15 (i.e. the signal corresponding to the block processed by that branch 11) is buffered in the corresponding FIFO output buffer 17. The contents of the output buffers 17 are multiplexed into an output signal at a multiplexer 20.

Thus, effectively, each part of the multiplexed signal is generated 'offline', in a round-robin manner, via a different branch 11, before being re-combined (multiplexed) at the output multiplexer 20 of the DPT modulator circuit 1 to re-combine the signals from the respective branches into a single modulated signal stream. Finally, the re-combined signal is sent to appropriate transmit circuitry (e.g. a switching amplifier and bandpass filter, shown in FIG. 2) for transmission at the required power level.

Beneficially, each branch 11 (thus each delta-sigma modulator portion 15) can operate at a relatively low rate of $f_s/M$, where '$f_s$' is the delta-sigma bitstream rate (e.g. a minimum of twice the carrier frequency), and 'M' is the number of branches. Thus, beneficially, by using an appropriate number of branches (which, in this example, effectively corresponds to the number of CIBs) and an appropriate delta-sigma bitstream rate (i.e. the internal processing frequency of the delta-sigma modulator portion 15 in each branch 11), it is possible to achieve efficient amplification whilst employing delta-sigma modulators at a significantly lower and more practical clock rate (e.g. in the range of approximately 50-200 MHz) than would otherwise be required.

The resulting delta-sigma amplification circuit 2 (including the DPT modulator 1) is able to achieve the necessary parallelism and linearity for high frequency applications such as amplification of radio frequency signals (e.g. OFDM).

Operation

A more detailed description will now be given (with reference to FIGS. 1 to 6) of an exemplary delta-sigma modulation technique implemented in accordance with an embodiment of the present invention.

Figure 2:
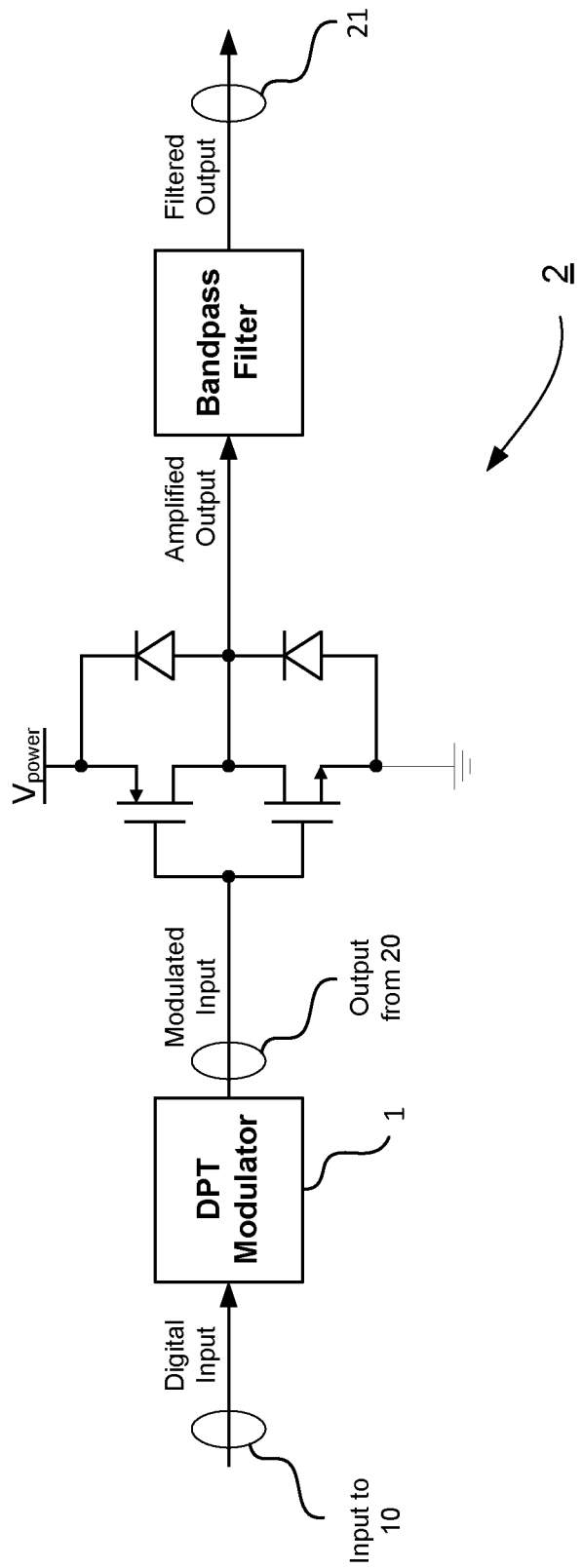
FIG. 2 is a schematic diagram of an exemplary radio frequency delta-sigma amplifier circuit which includes the delta-sigma modulator shown in FIG. 1.

FIG. 2 illustrates an exemplary S-class RF amplifier 2 which includes the DPT modulator 1 shown in FIG. 1.

As can be seen, the amplifier 2 can receive (at its input) a digital (e.g. OFDM) signal which may be at baseband, at an intermediate frequency or at the carrier frequency. The digital signal is optionally upsampled and frequency shifted, and then modulated by the DPT modulator 1. The modulated input signal is sent through a complementary metal-oxide-semiconductor (CMOS) or other type of transistor circuit, which results in an amplified output signal (denoted 'Amplified Output' in FIG. 2) being generated at the output of the transistor circuit. Finally, by applying an appropriate (typically bandpass) filtering, an output signal (substantially corresponding to a copy of the input signal, albeit at increased power level and shifted frequency) is provided at the output of the amplifier shown in FIG. 2.

Figure 3:
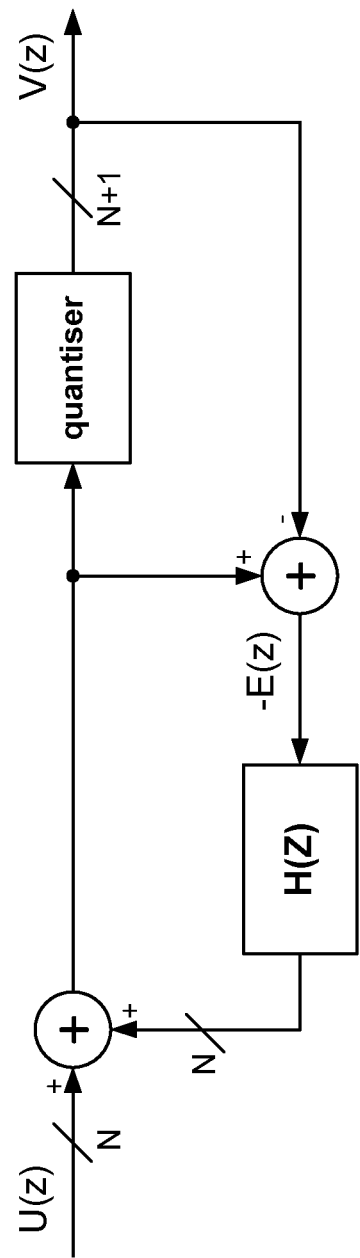
FIG. 3 is a schematic diagram illustrating an exemplary error feedback delta-sigma modulator forming part of the delta-sigma modulator shown in FIG. 1.

FIG. 3 illustrates an exemplary delta-sigma error feedback model that may be used to help understand operation of the delta-sigma modulator ($\Sigma\Delta M$) portion 15 shown in FIG. 1.

A delta-sigma modulator ($\Sigma\Delta M$) is effectively an infinite impulse response (IIR) filter, thus its current state depends on an infinite history of previous states (i.e. it has an impulse response which does not become zero past a certain point, but continues indefinitely). The delta-sigma modulator also has a non-linearity in its feedback loop meaning that standard linear time-invariant (LTI) analysis for the delta-sigma modulator fails.

In this example, in order to illustrate the operation of the feedback model, the quantiser shown in FIG. 3 may be considered, conceptually, to be replaced with the addition of a quantisation error, +E(z), which equals the difference between the quantiser's input and its output ($T_{output} - T_{input}$). Thus the following superposition can be exploited:

$$V(z) = NTF(z) \cdot E(z) + U(z)$$

where U(z) is the input signal, V(z) is the output signal, NTF(z) is a noise transfer function equal to 1−H(z) (H(z) being the feedback function as shown in FIG. 3), and E(z) is the quantisation error.

Therefore, in effect, the signal U(z) goes straight through to the output additively. Effectively, E(z) is a spectrally white quantisation error, but the feedback shapes it by the noise transfer function, NTF(z), forcing it to be correlated.

The noise transfer function (NTF(z)) is designed to dump noise energy into regions of spectrum outside a band of interest around 'U(z)'. Any signal (noise) falling into such outside or "don't care" regions may be removed from further processing by applying an appropriate filter to the signal (e.g. a bandpass filter, a pair of appropriately configured low-pass and high-pass filters, and/or the like). The resulting filtered signal is therefore more likely to comprise information corresponding to the input signal U(z) than noise.

Figure 4:
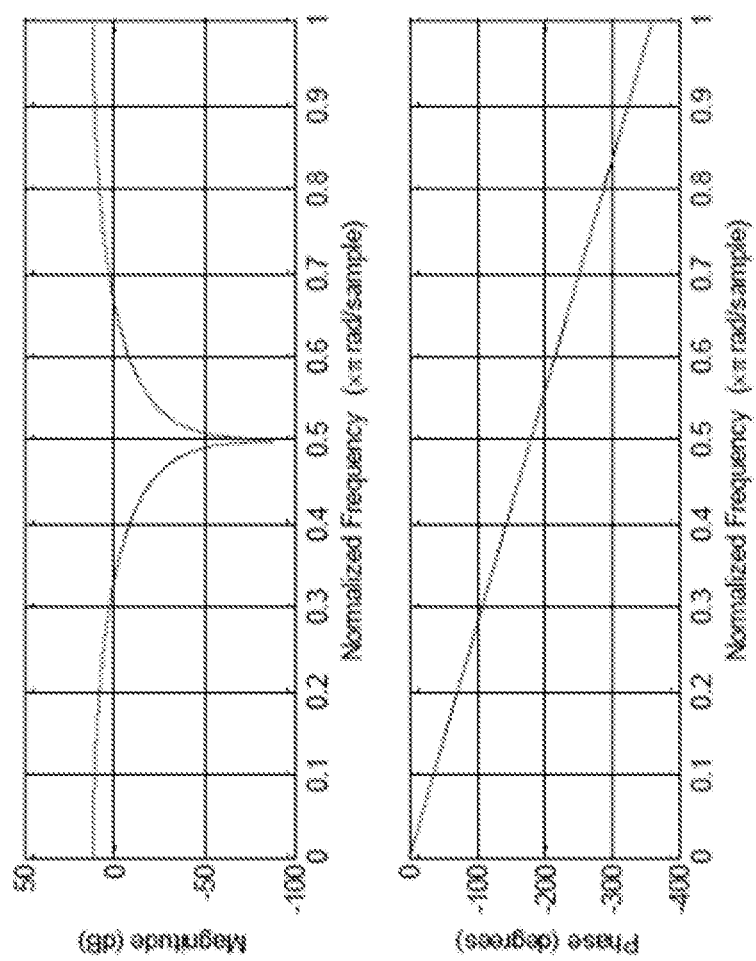
FIG. 4 illustrates an exemplary noise transfer function for bandpass delta-sigma amplifier in accordance with embodiments of the present invention.

FIG. 4 illustrates the resulting noise transfer function with a sharp notch around the carrier frequency '$f_c$' for an exemplary $4^{th}$ order bandpass delta-sigma amplifier, configured with the following parameters:

quantiser output is ±1;
NTF(z)=[1 0 2$z^{-2}$ 0 $z^{-4}$];
H(z)=1−NTF(z)=[0 0 −2$z^{-2}$ 0 −$z^{-4}$];
$f_c$=800 MHz (carrier frequency);
$f_s$=4$f_c$=3.2 GHz (i.e. the delta-sigma bitstream rate is four times the carrier frequency);
noise is outside of $f_s/4$ notch, removed by channel filtering after transistor amplifier; and
it has odd/even decomposition equivalent to two interleaved high-pass delta-sigma modulators.

Modulation Using Concatenated Independent Blocks

Figure 5:
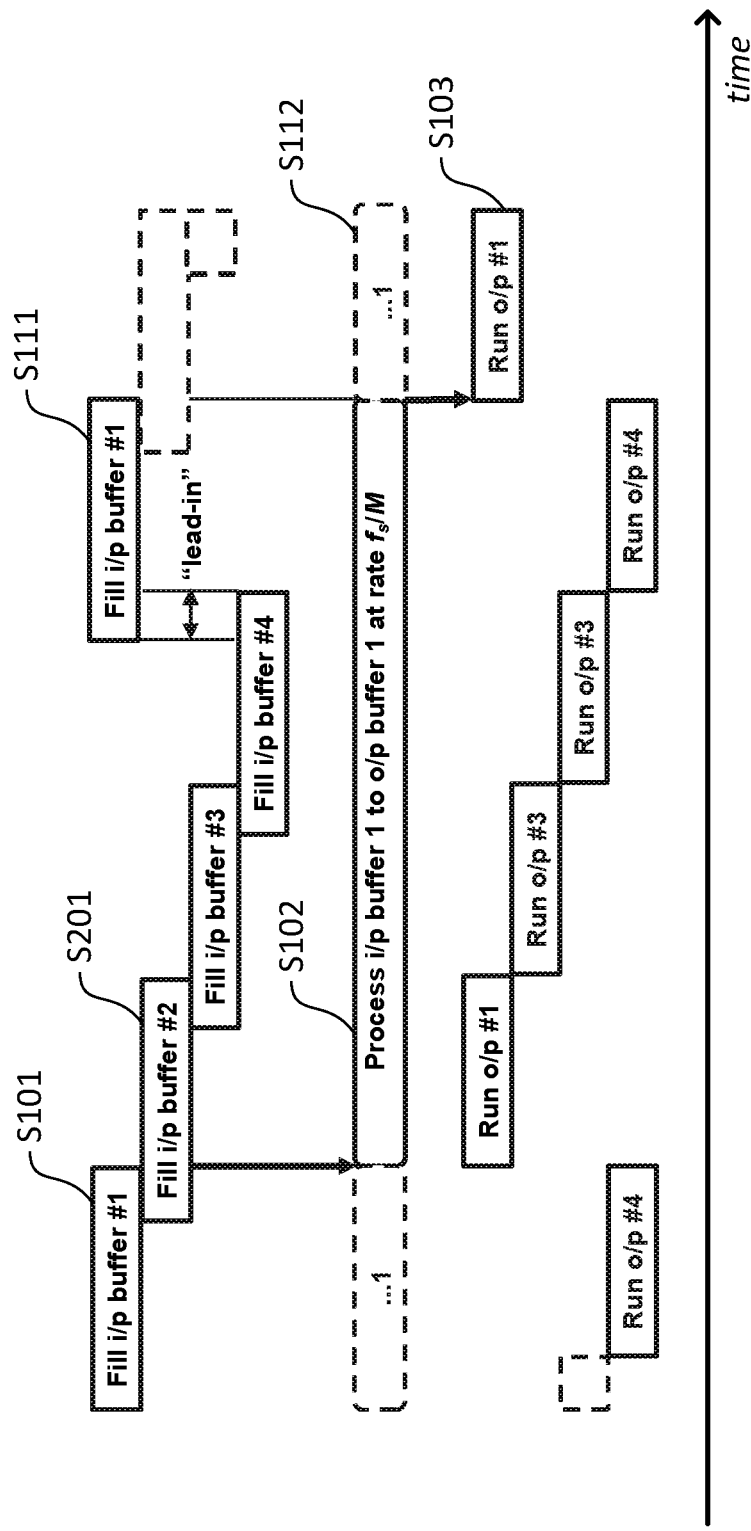
FIG. 5 is an exemplary timing snapshot illustrating the operation of a branch of a delta-sigma modulator employing concatenated independent blocks.

FIG. 5 is an example timing diagram (timing snapshot) illustrating a method carried out by components of the DPT modulator circuit 1 shown in FIG. 1. Specifically, FIG. 5 illustrates the operation of the first branch 11-1 in relation to the operation of the other branches 11 of the delta-sigma amplification circuit 1. For sake of simplicity, the number of branches in this case is four, although it will be appreciated that in practice a different (typically greater) number of branches may be used.

As illustrated generally at step S101, a processing round (for branch 11-1) begins by filling up the input buffer 12-1 with the corresponding block of data (i.e. the first demultiplexed portion of the data burst received at the input 10 of the DPT modulator circuit 1).

Next, in step S102, processing of the content of the input buffer 12-1 begins. Specifically, the delta-sigma modulator portion 15-1 reads the data from the input buffer 12-1 (e.g. following an appropriate upsampling and frequency shift by the upsampling and frequency shift portion 13-1) and performs an appropriate delta-sigma modulation at the rate of $f_s/M$ (where '$f_s$' is the delta-sigma bitstream rate; and 'M' is the number of branches, i.e. in this case, four). As generally shown in step S103, once the delta-sigma modulation for this block of data is complete, the modulated data is made available for sending to the output 20 (e.g. via output buffer 17-1).

As can be seen at step S111, prior to outputting the modulated signal at S103, the already emptied input buffer 12-1 is being filled up with the next block of data (i.e. the fourth subsequent block) that needs to be processed by this branch 11-1 so that upon outputting the processed (modulated) signal at S103, processing of the next block can begin immediately (at step S112).

Further, as shown generally at S201, the second branch 11-2 (and similarly the third and fourth branches) carries out the same procedure as explained above with reference to steps S101 to S103, albeit processing for each subsequent branch being shifted in time by the block length relative to the immediately preceding branch.

It is worth noting that, since the clock rate of the delta-sigma modulator portion 15-1 is one fourth of the overall bitstream rate (i.e. $f_s/4$), processing of each block of data will effectively take four times longer compared to conventional delta-sigma modulation techniques (which may not work at such a high frequency).

However, since each branch 11 processes its allocated block of data at the same rate, and since there are four branches (in this example) each processing one fourth of the transmit burst, the resulting output signal (at output 20) has the same rate as the original signal (at input 10).

Advantageously, as illustrated at step S111 of FIG. 5, an optional "lead-in" (comprising a predetermined number of overlapping samples) may be provided when filling up the input buffers 12 of each branch 11 prior to receiving the actual data to be processed by that branch 11. Such a lead-in may allow each branch 11 to reach a comparable state (to state of the preceding branch), which in turn may beneficially reduce/minimise transients resulting from switching between output blocks from one branch 11 (stream) to another.

For example, an optional overlap of at least 1% (but preferably between 5% and 20%) of the length of the processed block of data may greatly improve the overall noise floor resulting from processing of a series of (concatenated) blocks of data via multiple parallel branches 11. However, the use and the length of a lead-in overlap may depend on implementation, e.g. the type of signal being modulated, the level of amplification to be achieved, the number of branches/blocks used, whether the FIFO buffers are shared between branches, and/or the like.

Noise Floor

Figure 6:
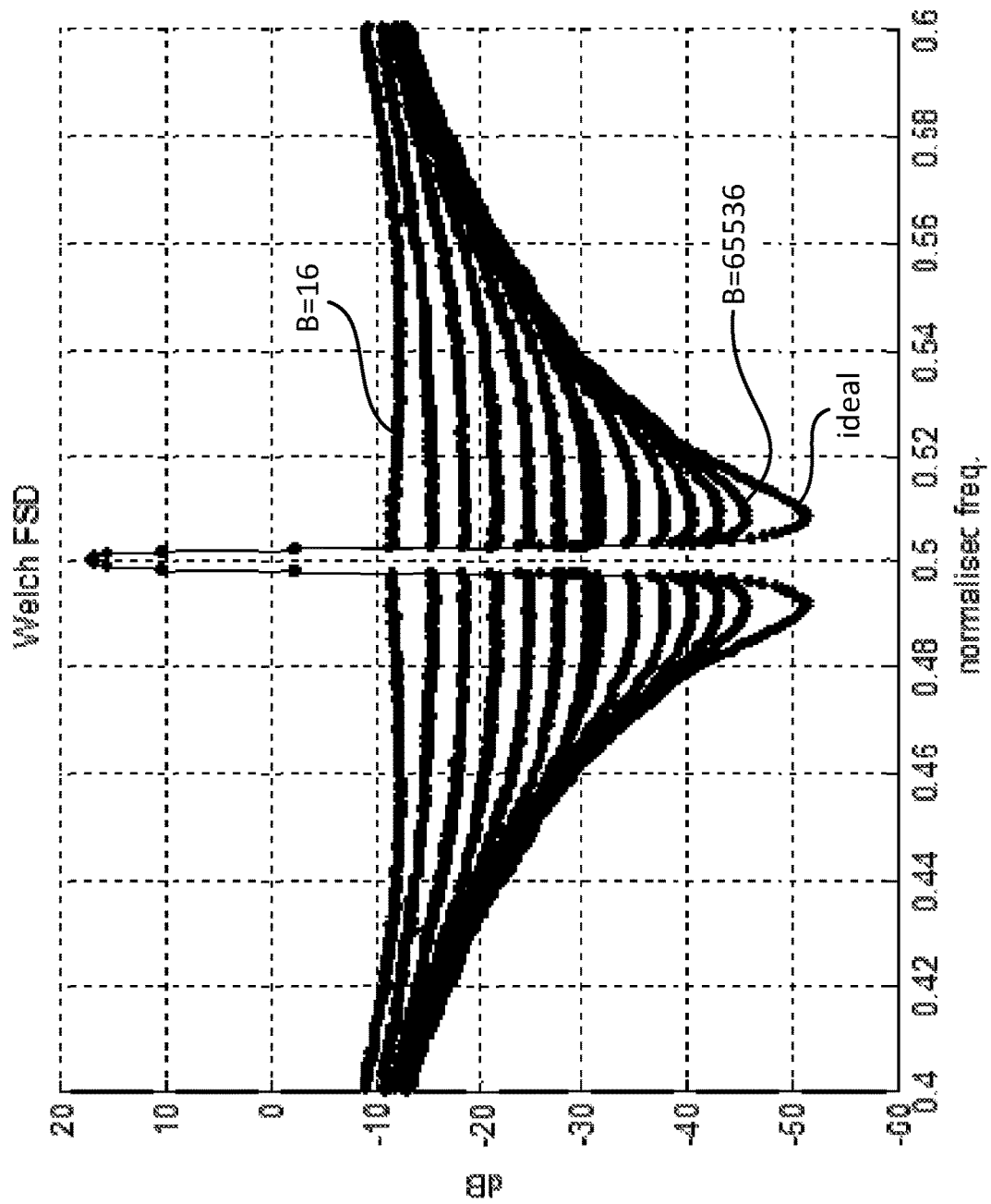
FIG. 6 is an exemplary power spectral density diagram illustrating simulation results for different block lengths.

FIG. 6 is an exemplary power spectral density diagram illustrating simulation results for different block lengths (B). Specifically, FIG. 6 illustrates the results for a simple test signal and $4^{th}$ order delta-sigma modulator (with $f_s=4f_c$). In this case, the bottom curve shows the ideal noise floor and the other curves (from top to bottom) show progressively better noise floors in the vicinity of the desired signal. The top curve corresponds to a block length of B=16 samples and the curve immediately above the ideal curve (i.e. the second curve from the bottom) corresponds to B=65536 samples. The lead-in time (L) used in this example is the same as the block length (i.e. L=B), which represents a pessimistically high estimate for a lead-in time that would be required in real life scenarios. In any case, it has been found empirically that varying the value of L (e.g. choosing a lower L value) has negligible effect on the curves compared to the effect of the block length (B). However, it will be appreciated that an appropriate lead-in time (e.g. L<B) may be necessary in case of the architecture shown in FIG. 1 in order to flush the finite memory of the upsamplers and frequency shifter portions 13 and delta-sigma modulator portions 15 to the correct state.

The results show that with sufficiently long block-length (B), the noise-floor of the DPT modulator circuit 1 approaches that of a conventional delta-sigma modulator. The resulting noise floor is therefore sufficiently low for practical RF amplifier applications.

Extension to High-Order Modulators

The order of a delta-sigma modulator is determined by the order of noise shaping filter (H(z) in FIG. 3).

Generally, high-order (e.g. sixth order and above) delta-sigma modulators are known to provide a number of performance benefits compared with lower-order (e.g. fourth order) delta-sigma modulators. For example, a sixth order delta-sigma modulator generates a significantly lower noise floor in the frequencies surrounding a wanted signal, which results in a wanted signal with higher signal to noise ratio.

Moreover, it is also beneficial to use the largest possible numerical signal at the input to a delta-sigma modulator because doing so results in generation of the largest possible wanted output signal, and maximises the ratio of wanted output signal power to the total output power, thereby simplifying the task of creating a power-efficient amplifier.

However, higher order delta-sigma modulators are only conditionally stable. As a result, only signals below a certain maximum input level can be converted without causing the modulator to become unstable. The level at which the modulator becomes unstable is a function of the modulator order with higher order modulators becoming unstable at lower input levels. A delta-sigma modulator is not useful once unstable because the delta-sigma modulator ceases to have the desired noise shaping properties. Consequently, there is a trade-off between increasing the order of the modulator and the maximum input level. Sixth-order delta-sigma modulators, for example, are known to become unstable for input signals of a level that might otherwise be desirable for simplifying the task of creating a power-efficient amplifier.

Beneficially, a variation on the above examples allows higher-order delta-sigma modulation to be applied, without causing an undesirable level of instability.

Specifically, in this example, the DPT modulator 1 employs high-order (in this example sixth-order) delta-sigma modulators 15 to process concatenated independent blocks of finite length, where the delta-sigma modulator 15 is reset to its initial state before processing each new block. Advantageously, this takes advantage of the fact that modulator instability only becomes apparent after a very large number of input samples (typically millions).

It can be shown that by resetting the delta-sigma modulator 15 between each block, the DPT modulator 1 can remain stable for significantly larger numerical input signals than would have been possible for a conventional sixth-order delta-sigma modulator. Accordingly, this allows the DPT modulator to generate a significantly larger wanted output signal than would otherwise have been possible, which simplifies the task of creating a power-efficient amplifier.

Moreover, using a fixed block length, as described above, for the DPT modulator 1 has the potential to allow the use of other complex of noise-shaping filters which would otherwise be unstable when employed within a conventional delta-sigma modulator.

Benefits

In summary, the delta-sigma amplification circuit 2 with DPT modulator circuit 1 provides at least the following benefits over conventional delta-sigma amplifiers.

The DPT modulator circuit 1 is able to achieve a higher bitstream rate (than conventional delta-sigma modulators) since each parallel path can be computed independently at a slower clock rate. The DPT modulator circuit 1 may also achieve a low noise floor (suitable for RF use) by making the block lengths arbitrarily long.

In addition, the DPT modulator circuit 1 may beneficially employ a wide range of noise-shaping filters, e.g. filters that include multi-bit multiplications (due to the lower clock rate of the filters). Similarly, the DPT modulator circuit 1 may also employ reprogrammable noise-shaping filters that include multi-bit multiplications (due to the lower clock rate of the filters).

The DPT modulator circuit 1 may be used as part of a particularly efficient, linear RF amplifier circuit 2. In this case, the following benefits may also be achieved:
  operation at a high frequency by virtue of the DPT modulator's 1 overall high delta-sigma bitstream rate (measured at its output 20);
  high linearity (due to the high delta-sigma bitstream rate); power efficiency; and
  high flexibility with respect to amplification level and/or operating at any frequency (typically up to half the delta-sigma bitstream rate).

Other Modifications and Alternatives

Detailed embodiments have been described above. As those skilled in the art will appreciate, a number of modifications and alternatives can be made to the above embodiments whilst still benefiting from the inventions embodied therein. By way of illustration only a number of these alternatives and modifications will now be described.

Whilst in the above examples, M parallel streams (branches 11-1 to 11-M) are shown, it will be appreciated that the actual number of parallel streams used may depend on the frequency of the RF signal to be processed by the delta-sigma amplifier. For example, the higher the frequency of the RF signal, the more streams may be used (whilst any unused streams may be switched off).

It will be appreciated that there is no limit to the number of parallel branches (M) that can be used, allowing each parallel path to operate at an arbitrarily low clock frequency.

An additional cost associated with the CIB delta-sigma amplifier of FIG. 2 (compared to conventional delta-sigma amplifiers) results from the need for additional silicon area to implement the parallel branches. However, this cost is in practice quite small and can be reduced to less than US $1.

The largest potential impact on silicon area is the need for input FIFO buffers before the delta-sigma modulators. If the input buffers are placed directly at the input of their associated delta-sigma modulator then they must be greater than B samples deep. However, if the input buffers are placed at the input of their associated upsampler and frequency shift portion (as shown in FIG. 1) then they may be reduced in size by the upsampling ratio (which is typically 200). The configuration shown in FIG. 1 thus beneficially reduces the associated silicon size (and hence cost) for the input buffers to a negligible level.

Nevertheless, the order of the input FIFO buffers 12 and upsampler and frequency shift portions 13 may be reversed, albeit at the potential cost of an increase in the overall size of the FIFO buffer and hence silicon area or circuit board required to implement the delta-sigma amplifier.

It will be appreciated that the functionality provided by the upsampler and frequency shift portions is optional and it is not necessary for realising the DPT modulator shown in FIG. 1.

As described above with reference to FIG. 6, the concatenated independent blocks (CIB) based approach employed by the RF amplifier may introduce a noise floor in the band-of-interest. The noise floor is largely influenced by the number of times it is necessary to switch between parallel delta-sigma paths—i.e. the smaller the blocks are, the more often it is necessary to switch between parallel delta-sigma paths, resulting in an increased noise. In other words, the noise floor may be reduced by increasing the block length, albeit at the expense of increased latency and memory size.

It will be appreciated that it may be possible to reduce the noise transient associated with switching between parallel delta-sigma paths (i.e. from branch to branch) by having a window period over which the delta-sigma streams overlap and applying statistical fading between the outputs of the two bitstreams. Statistical fading between two bitstreams may be achieved, for example, by choosing bits from either a first or a second bitstream on a weighted random basis. In this case, at the start of the fading window, bits are more likely to be chosen from the first bitstream; at the middle of the fading window bits are equally likely to be chosen from either bitstream; and at the end of the fading window, bits are more likely to be chosen from the second bitstream.

It may also be possible to reduce the noise transient and noise floor associated with switching between parallel delta-sigma paths by providing an overlapping window period. In this case, switchover may occur, during this window period, at the cycle of minimum/optimal state difference between the two delta-sigma modulator paths.

In one particularly beneficial example, data from two parallel bit streams each representing a different respective delta-sigma path for the same data, but with the boundary of CIBs at different positions, may be combined using a predetermined window function to weight the contribution from each path version to the combined total. Such a window function (or 'weighting function') may be employed for gradually switching between the outputs of the two path versions, and then back again, such that the contribution from data at the edges of the CIBs in each path is minimised. Such gradual switching may result in a significantly reduced noise floor compared to the case when using the output of a single bitstream only (for a given block length). In other words, by gradually alternating between the outputs of the two versions of the delta-sigma path using a window function, the RF amplifier may achieve the same (or in some cases lower) noise floor even at relatively small block lengths, as a DPT circuit employing a large block length (but no weighting window). Accordingly, the drawbacks (e.g. latency) associated with increased block length can be alleviated by employing a window function based gradual switching between the outputs of two bitstreams (even for relatively small block lengths).

It will be appreciated that a number of suitable window functions may be used to achieve a reduced noise floor without requiring an increase of the block length to an undesirable level. It will be appreciated that such a window function may be applied to the bitstreams (the outputs of which are being combined) at a suitable point (e.g. after the respective multiplexer circuit outputs of two versions of the circuit shown in FIG. 1). Two of such exemplary window functions are described below with reference to FIGS. 7a to 10.

Figure 7A:
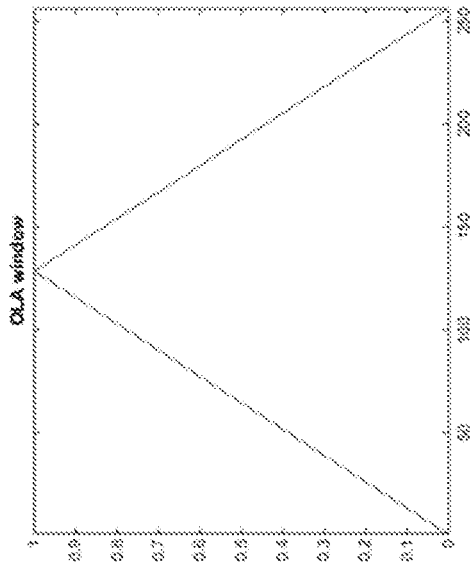
FIGS. 7a and 7b illustrate an exemplary window function and a possible implementation thereof.
Figure 7B:
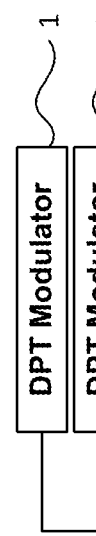
Figure 8:
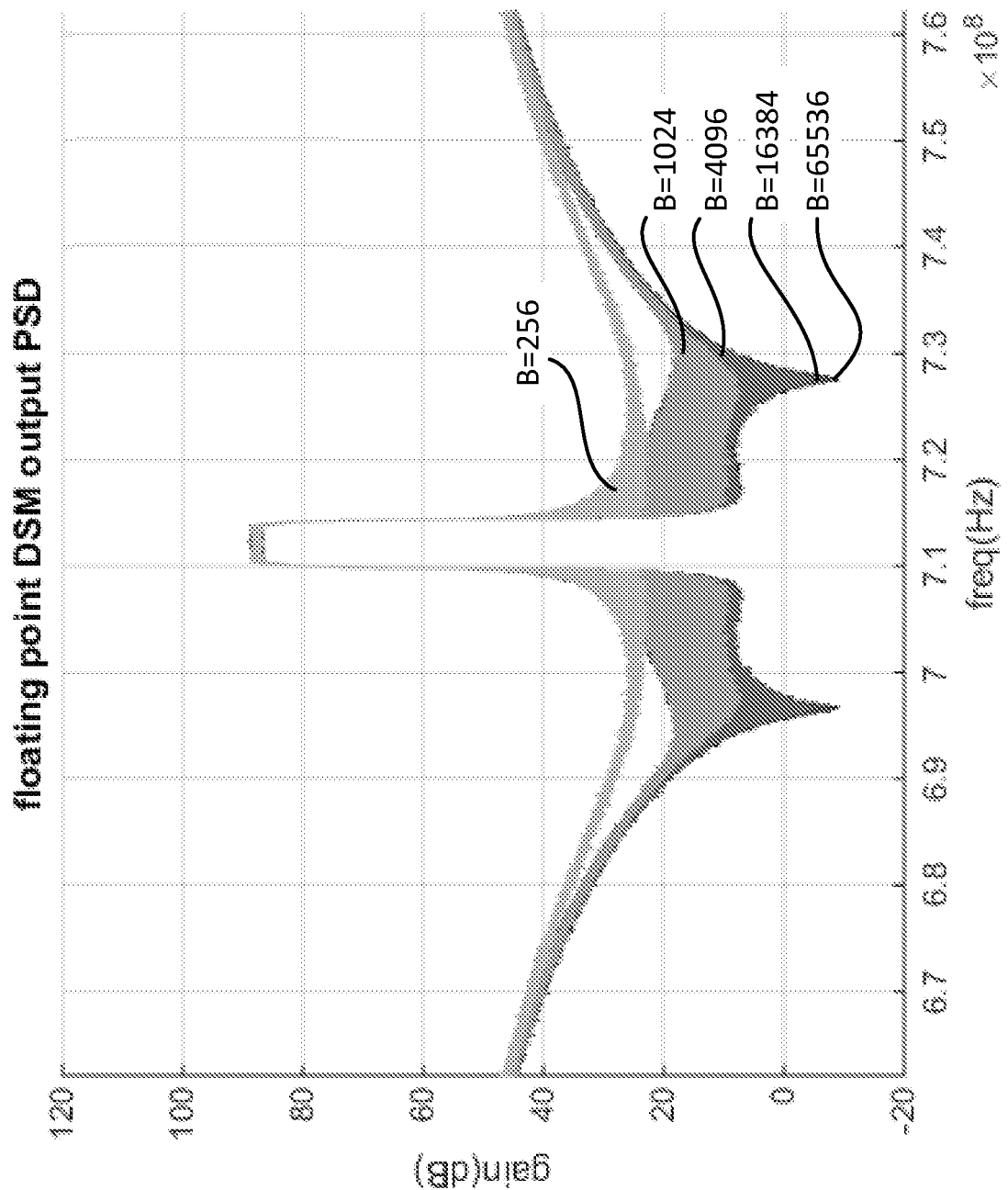

In a first example, the outputs of two DPT modulator units are combined in a weighted fashion according to a triangular window function shown in FIGS. 7a and 7b. FIG. 8 shows the resulting spectrum (using a 6th order 40 MHz bandwidth, 3 GHz sample rate).

It has been shown that using the triangular window function, the noise floor drops by 6 dB for each doubling of the block length (compared to a drop of 3 dB when not using the triangular window function). Importantly, the performance of a regular CIB (an RF amplifier that does not use a window function) with block length 'N' can be achieved with block length sqrt(N) when using a window function (e.g. as shown in FIGS. 7a and 7b).

Beneficially, this windowing approach produces a dramatic reduction in delay and required memory resources. It allows achieving a performance equivalent to conventional delta-sigma converters (where, effectively, 'N'=infinity) using block lengths in the range of N=256 to N=1000 (approximately).

Figure 9A:
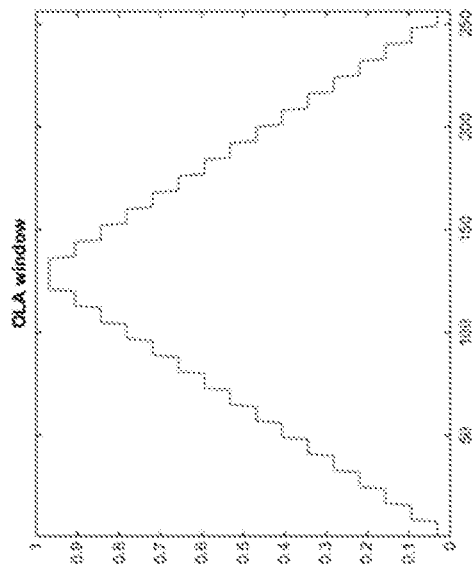
FIGS. 9a and 9b illustrate another exemplary window function and a possible implementation thereof.
Figure 9B:
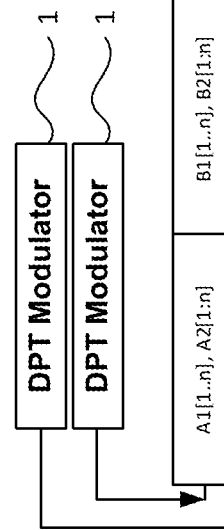
Figure 9B:
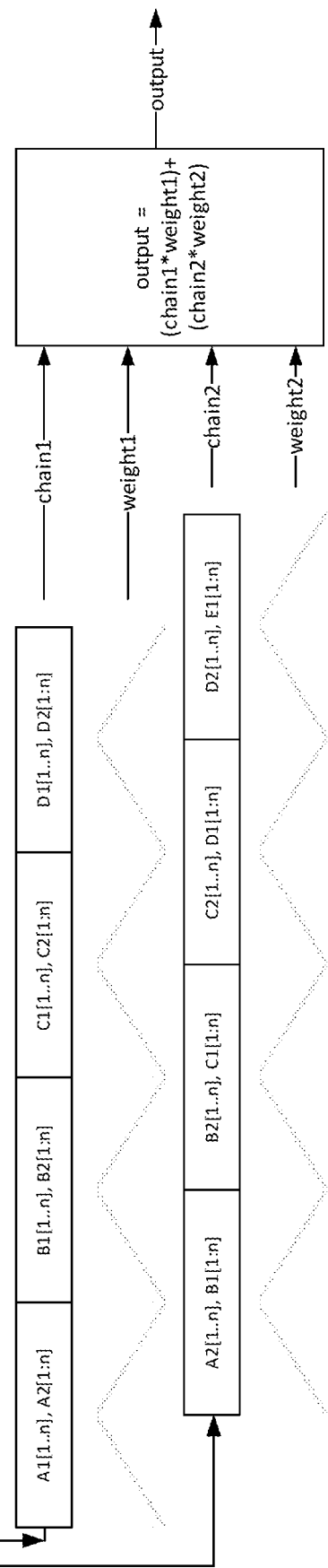
Figure 10:
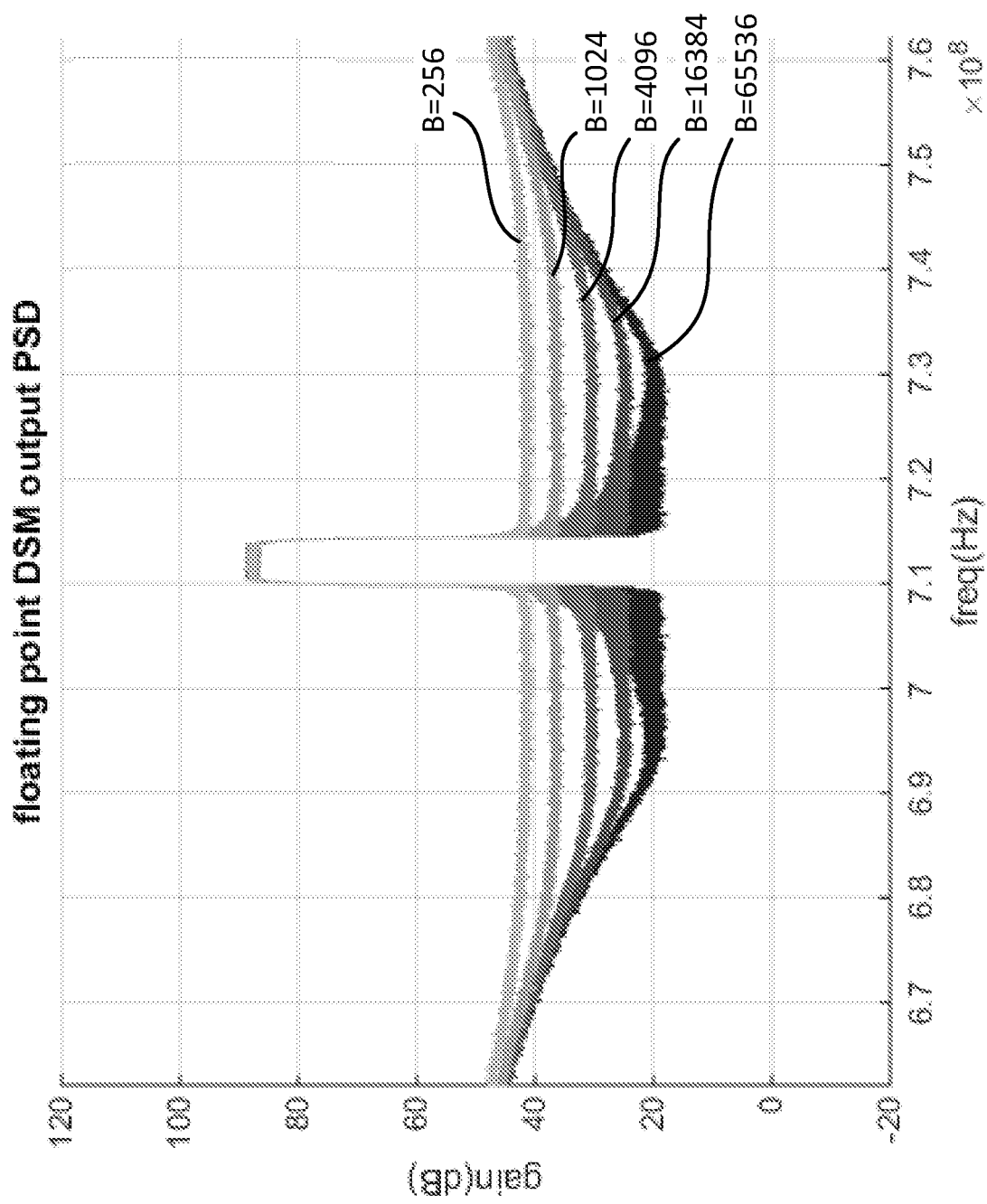

FIGS. 9a and 9b illustrate a stepped triangular window function (with 4-bit resolution in the steps, i.e. 16 distinct steps), and FIG. 10 illustrates the resulting spectrum (using a 6th order 40 MHz bandwidth, 3 GHz sample rate). Although the effect of such a stepped triangular window on the noise floor is not as good as that of the triangular window of FIG. 7a, however, it is approximately 10 to 12 dB better than using a regular CIB (that does not employ a window function). This suggests a reduction of about 3 dB in the noise floor for each bit of resolution in the stepped triangular window. This also suggests that about 10 bits of resolution would be required to achieve optimal performance when using a stepped triangular window function with a blocks length of N=256.

It will be appreciated that when employing a window function, the combined weight of the contributions from the two path versions (i.e. the sum of 'weight1' and 'weight2' in FIGS. 7b and 9b) is constant.

It will be appreciated that the DPT modulator will typically be implemented on an application-specific integrated circuit (ASIC) or a field-programmable gate array (FPGA). The delta-sigma bitstream may be routed to multiple serializer/deserializer (SerDes) outputs, which may allow easy connection to multiple RF driver stages with different bandpass characteristics.

It will be appreciated that FPGAs are available with SerDes that are able to switch at 28 GHz. It is therefore possible to support delta-sigma RF amplifiers for microwave applications (e.g. up to 14 GHz).

It will be appreciated that the delta-sigma amplifier may generate signals for multiple carriers spaced across a wide band (i.e. the same delta-sigma amplifier may be configured to operate over a wide bandwidth with several carriers spaced within that bandwidth; alternatively the same delta-sigma amplifier may be configured to operate over several narrow bands, spaced over a wide bandwidth, with a carrier in each of the narrow bands).

It will be appreciated that any non-linearity caused by RF driver transistors and/or analogue bandpass filter may be compensated via pre-distortion of the modulated signal.

It will be appreciated that certain high-power RF transistors may not be fast enough for some applications. In order to alleviate such limitations, the delta-sigma bitstream may be extended from binary to multi-bit in order to drive multiple RF transistors simultaneously. In this case, the RF transistors may have equal or weighted drive strengths.

It will be appreciated that a DPT modulator using multiple branches may be implemented as part of a digital to analogue converter and/or as part of an analogue to digital converter.

It will be appreciated that a DPT modulator using multiple branches may be implemented as part of a radio transmitter and/or a radio receiver.

In the above description, an exemplary implementation is given for a delta-sigma amplifier for LTE communications technology. However, it will also be appreciated that the above solution may also be implemented using other communications technologies such as Wi-Fi, Bluetooth, and/or the like. The above embodiments are applicable to both 'non-mobile' and generally stationary communication devices, such as user equipment and/or base station apparatus.

The splitting means might comprise a demultiplexer and the combining means might comprise a multiplexer.

Each delta-sigma modulation means might be configured to operate at a branch modulation rate generally inversely dependent on the number of branches. For example, the modulation rate might be at least approximately defined by the equation $f_b = f_s/M$, where '$f_b$' is the branch modulation rate, '$f_s$' is a fundamental modulation rate required for processing a signal having said carrier frequency using a single delta-sigma modulator, and 'M' is the number of branches.

The carrier frequency might be between 800 MHz and 14 GHz (preferably between 800 MHz and 2600 MHz as used in LTE networks) and each delta-sigma modulation means might be configured to operate at a branch modulation rate of between 50 MHz and 200 MHz.

The plurality of signal processing branches might be configured to perform delta-sigma modulation of each of said plurality of data stream portions in a substantially parallel manner.

The splitting means might be operable to split said input data stream into a sequence of chronologically generally consecutive blocks, each block forming a different one of said data stream portions. In this case, each of said generally consecutive blocks might have a portion that is common to at least one (preferably two) neighbouring blocks of said sequence.

Each of said plurality of signal processing branches might have a respective input buffer for buffering associated data stream portions. Each input buffer might comprise a first-in/first-out (FIFO) buffer.

Each of said plurality of signal processing branches might comprise respective means for upsampling and frequency shifting input data for modulation by said delta-sigma modulation means of that branch.

The plurality of data stream portions might comprise a plurality of concatenated independent blocks of data.

The delta-sigma modulation may advantageously be applied in an amplifier that employs a class-D output stage. This provides, inter alia, benefits in terms of power efficiency.

Various other modifications will be apparent to those skilled in the art and will not be described in further detail here.

The invention claimed is:

1. A modulator circuit comprising:
   circuitry configured to receive an input data stream;
   circuitry configured to split the input data stream into a plurality of data stream portions;
   a plurality of signal processing branches, each signal processing branch comprising a delta-sigma modulator for performing a delta-sigma modulation of a respective data stream portion of said plurality of data stream portions to generate a modulated signal and circuitry configured to upsample and frequency shift input data, for subsequent modulation by said delta-sigma modulator of the respective branch; and
   circuitry configured to combine the respective modulated signal from each of said plurality of signal processing branches to form an output signal, and to output said output signal.

2. The modulator circuit according to claim 1, wherein each delta-sigma modulator is a bandpass delta-sigma modulator.

3. The modulator circuit according to claim 1, wherein each delta-sigma modulator is configured to operate at a branch modulation rate generally inversely dependent on a quantity of branches.

4. The modulator circuit according to claim 3, wherein said modulation rate is at least approximately defined by the following equation:

$$f_b = f_s/M$$

wherein:
   $f_b$ is the branch modulation rate;
   $f_s$ is a fundamental modulation rate required for processing a signal having a given carrier frequency using a single delta-sigma modulator; and
   M is the number of branches.

5. The modulator circuit according to claim 1, wherein said circuitry configured to split the input data stream into a plurality of data stream portions is operable to split said input data stream into a sequence of chronologically generally consecutive blocks, each block forming a different one of said data stream portions.

6. The modulator circuit according to claim 5, wherein said blocks have a length that is set to provide a desired noise floor.

7. The modulator circuit according to claim 1, wherein each of said plurality of signal processing branches has a respective input buffer for buffering associated data stream portions at an input side of said circuitry configured to upsample and frequency shift input data.

8. The modulator circuit according to claim 1, further comprising at least one noise-shaping filter, wherein said noise-shaping filter is operable to utilise a multi-bit multiplication, wherein said noise-shaping filter comprises a reprogrammable noise-shaping filter.

9. The modulator circuit according to claim 1, wherein said modulator circuit is operable to reset each said delta-sigma modulator, to an original internal state, between processing each data stream portion and processing a subsequent data stream portion.

10. The modulator circuit according to claim 9, wherein each said delta-sigma modulator is of an order that would result in that delta-sigma modulator becoming unstable when processing a data stream portion above a particular length and wherein a size of each data stream portion is set to be shorter than said particular length at which said delta-sigma modulator becomes unstable.

11. A circuit comprising a plurality of circuit portions, wherein each circuit portion of the plurality of circuit portions respectively comprises the modulator circuit according to claim 1 that produces a corresponding output signal, the circuit further comprising:
   circuitry configured to generate a combined output signal from the corresponding output signals of each circuit portion;
   wherein said generating comprises applying a respective window function to each of said corresponding output signals and adding the resulting signals together to form said combined output signal.

12. The circuit according to claim 11, wherein the plurality of data stream portions of a first circuit portion of the plurality of circuit portions are offset in time compared to the plurality of data stream portions of a second circuit portion of the plurality of circuit portions, and wherein said applying of a respective window function comprises applying a respective time dependent weight to each of the output signals of the first circuit portion and the second circuit portion.

13. The circuit according to claim 12, wherein said respective time dependent weights applied to each of the output signals of the first circuit portion and the second circuit portion sum together to give a constant.

14. A method performed by a modulator circuit comprising a plurality of signal processing branches having a delta-sigma modulator for performing a delta-sigma modulation, the method comprising:
   receiving an input data stream;
   splitting the input data stream into a plurality of data stream portions;
   in each of said plurality of signal processing branches, upsampling and frequency shifting a respective data stream portion of said plurality of data stream portions and subsequently performing a delta-sigma modulation of the frequency shifted data stream portion in order to generate a modulated signal;
   combining the respective modulated signal from each of said plurality of signal processing branches to form an output signal; and
   outputting said output signal.

15. An amplifier circuit comprising the modulator circuit according to claim 1.

16. An apparatus comprising a digital to analogue converter that employs a modulator circuit according to claim 1.

17. An apparatus comprising an analogue to digital converter that employs a modulator circuit according to claim 1.

18. An apparatus comprising a radio transmitter that employs a modulator circuit according to claim 1.

19. An apparatus comprising a radio receiver that employs a modulator circuit according to claim 1.

20. A non-transitory, computer readable media comprising computer implementable instructions for causing a programmable computer device to perform the method of claim 14.

21. A modulator circuit comprising:
   circuitry configured to receive an input data stream;
   circuitry configured to split the input data stream into a plurality of data stream portions;
   a plurality of signal processing branches, each signal processing branch comprising a delta-sigma modulator for performing a delta-sigma modulation of a respective data stream portion of said plurality of data stream portions in order to generate a modulated signal and circuitry configured to upsample and frequency shift input data, for modulation by said delta-sigma modulator of that branch; and circuitry configured to combine the respective modulated signal from each of said plurality of signal processing branches to form an output signal and to output said output signal;

wherein said circuitry configured to split the input data stream into a plurality of data stream portions is operable to split said input data stream into a sequence of chronologically generally consecutive blocks, each block forming a different one of said data stream portions; and wherein said blocks have a length that is set to provide a desired noise floor.

22. A method performed by a modulator circuit comprising a plurality of signal processing branches having a delta-sigma modulator for performing a delta-sigma modulation, the method comprising:

receiving an input data stream;

splitting the input data stream into a plurality of data stream portions;

in each of said plurality of signal processing branches, upsampling and frequency shifting a respective data stream portion of said plurality of data stream portions and subsequently performing a delta-sigma modulation of the frequency shifted data stream portion in order to generate a modulated signal;

combining the respective modulated signal from each of said plurality of signal processing branches to form an output signal; and outputting said output signal;

wherein the input data stream is split into a sequence of chronologically generally consecutive blocks, each block forming a different one of said data stream portions; and wherein said blocks have a length that is set to provide a desired noise floor.

23. A modulator circuit comprising:

circuitry configured to receive an input data stream;

circuitry configured to split the input data stream into a plurality of data stream portions;

a plurality of signal processing branches, each signal processing branch comprising a delta-sigma modulator for performing a delta-sigma modulation of a respective data stream portion of said plurality of data stream portions in order to generate a modulated signal and circuitry configured to upsample and frequency shift input data, for modulation by said delta-sigma modulator of that branch; and circuitry configured to combine the respective modulated signal from each of said plurality of signal processing branches to form an output signal, and to output said output signal;

wherein said modulator circuit is operable to reset each said delta-sigma modulator, to its original internal state, between processing each data stream portion and processing a subsequent data stream portion.

24. The modulator circuit according to claim 23 wherein each said delta-sigma modulator is of an order that would result in that delta-sigma modulator becoming unstable when processing a data stream portion of above a particular length and wherein the size of each data stream portion is set to be shorter than said particular length at which said delta-sigma modulator becomes unstable.

25. A method performed by a modulator circuit comprising a plurality of signal processing branches having a delta-sigma modulator for performing a delta-sigma modulation, the method comprising:

receiving an input data stream;

splitting the input data stream into a plurality of data stream portions;

in each of said plurality of signal processing branches, upsampling and frequency shifting a respective data stream portion of said plurality of data stream portions and subsequently performing a delta-sigma modulation of the frequency shifted data stream portion in order to generate a modulated signal;

combining the respective modulated signal from each of said plurality of signal processing branches to form an output signal; and outputting said output signal;

wherein each said delta-sigma modulator is reset, to its original internal state, between processing each data stream portion and processing a subsequent data stream portion.

* * * * *

UNITED STATES PATENT AND TRADEMARK OFFICE
CERTIFICATE OF CORRECTION

PATENT NO. : 10,686,417 B2
APPLICATION NO. : 15/520378
DATED : June 16, 2020
INVENTOR(S) : Bryan James Donoghue et al.

Page 1 of 1

It is certified that error appears in the above-identified patent and that said Letters Patent is hereby corrected as shown below:

On the Title Page

Item (72) Inventors:
"Bryan James Donoghue, Cambridge (GB), Desmond Phillips, Cambridge (GB); Tan Robert, Cambridge (GB); Peter-Contesse Herve, Cambridge (GB)"

Should be:
-- Bryan James Donoghue, Cambridge (GB), Desmond Phillips, Cambridge (GB); Robert Tan, Cambridge (GB); Hervé Péter-Contesse, Cambridge (GB) --.

Signed and Sealed this
Twenty-third Day of March, 2021

Drew Hirshfeld
*Performing the Functions and Duties of the
Under Secretary of Commerce for Intellectual Property and
Director of the United States Patent and Trademark Office*